(12) United States Patent
Ikegami

(10) Patent No.: US 6,608,372 B2
(45) Date of Patent: Aug. 19, 2003

(54) SURFACE MOUNTABLE CHIP TYPE SEMICONDUCTOR DEVICE AND MANUFACTURING METHOD

(75) Inventor: Gorou Ikegami, Shiga (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/083,998

(22) Filed: Feb. 25, 2002

(65) Prior Publication Data

US 2002/0117762 A1 Aug. 29, 2002

(30) Foreign Application Priority Data

Feb. 27, 2001 (JP) .......................................... 2001-051403

(51) Int. Cl.⁷ .......................... H01L 23/02; H01L 21/44
(52) U.S. Cl. ........................ 257/686; 257/687; 257/738; 257/773; 257/783; 257/787; 438/109; 438/118; 438/127; 438/612; 438/613
(58) Field of Search ................................. 438/108, 118, 438/119, 125, 126, 127, 612, 613, 109; 257/687, 737, 738, 772, 773, 778, 780, 782, 783, 786, 787, 685, 686; 228/180.21, 180.22

(56) References Cited

U.S. PATENT DOCUMENTS 6,140,155 A * 10/2000 Mihara et al. .............. 438/124
6,486,551 B1 * 11/2002 Sato et al. .................. 257/737
2001/0038151 A1 * 11/2001 Takahashi et al. .......... 257/778
2002/0036345 A1 * 3/2002 Iseki et al. .................. 257/734

FOREIGN PATENT DOCUMENTS

| JP | 06-125021 | 5/1994 |
| JP | 07-169766 | 7/1995 |
| JP | 10-313082 | 11/1998 |
| JP | 2000-277542 | 10/2000 |

* cited by examiner

Primary Examiner—David L. Talbott
Assistant Examiner—Alonzo Chambliss
(74) Attorney, Agent, or Firm—Katten Muchin Zavis Rosenman

(57) ABSTRACT

A surface mountable chip type semiconductor device comprises: first and second conductive land areas which are formed on an insulating substrate and which are electrically coupled with each other; a conductive post formed on the first conductive land area; and a semiconductor pellet which has electrodes on both sides thereof and which is mounted on the second conductive land area. A main area of the insulating substrate including the conductive post and the semiconductor pellet is encapsulated by encapsulation resin. Top portions of the conductive post and an external electrode electrically coupled to the semiconductor pellet are exposed from the encapsulation resin. Top surfaces of the conductive post and the external electrode are approximately coplanar with each other.

20 Claims, 5 Drawing Sheets

PRIOR ART

SURFACE MOUNTABLE CHIP TYPE SEMICONDUCTOR DEVICE AND MANUFACTURING METHOD

FIELD OF THE INVENTION

The present invention relates generally to a chip type semiconductor device, and more particularly to a surface mountable chip type semiconductor device which has high moisture resistance and which has thin and small device shape.

BACKGROUND OF THE INVENTION

It is required that small type and portable electronic circuit apparatuses, for example, a video camera, a personal computer, a portable telephone and the like, are compact and lightweight. Therefore, it is also required that electronic parts or components used in such electronic circuit apparatuses are compact and lightweight. As an electronic component which fulfills such requirements, there is known a chip type semiconductor device disclosed in Japanese patent laid-open publication No. 6-125021 (prior art 1). FIG. 17 shows a cross sectional structure of the chip type semiconductor device which is generally designated by a reference numeral 6 in the drawing and which is disclosed in Japanese patent laid-open publication No. 6-125021.

In FIG. 17, a reference numeral 1 designates a semiconductor pellet which constitutes the main portion of the electronic component. The semiconductor pellet 1 has electrodes (not shown in the drawing) formed on both surfaces thereof. A reference numeral 2 designates an island portion on which the semiconductor pellet 1 is mounted. Reference numerals 3a and 3b designate lead portions. One end of the lead portion 3a is electrically connected to the island portion 2. The other lead portion 3b is disposed such that one end of the lead portion 3b is located in the proximity of the island portion 2. Outer ends of both lead portions 3a and 3b extend outside. Reference numeral 4 designates a wire which electrically couples an electrode (not shown in the drawing) on the semiconductor pellet 1 and the lead portion 3b. Reference numeral 5 designates an encapsulation resin portion which encapsulates a main portion of the semiconductor device 6 including the semiconductor pellet 1 and the like.

In the semiconductor device 6, each of the lead portions 3a and 3b are bent within the encapsulation resin portion 5 into a crank shape approximately at the middle portion thereof. Also, a portion from the middle portion to the outer end portion of each of the lead portions 3a and 3b is exposed from the encapsulation resin portion 5 and extracted outside along the bottom surface 5a of the encapsulation resin portion 5. The outer end portion of each of the lead portions 3a and 3b is cut in the proximity of a corresponding side wall of the encapsulation resin portion 5. In the semiconductor device shown in FIG. 17, the portions from the middle portions to the outer end portions of the lead portions 3a and 3b which are exposed from the encapsulation resin portion 5 are set to become approximately coplanar. Therefore, the semiconductor device shown in FIG. 17 can be surface mounted stably on a wiring substrate and the like.

The semiconductor device shown in FIG. 17 is fabricated by using a lead frame (not shown in the drawing) which integrally includes the island portion 2 and lead portions 3a and 3b. In order to obtain a compact and thin semiconductor device, it is necessary to use the lead frame which is made of a thin material and which is minutely worked into desired patterns. Also, it is necessary to reduce the loop height of the wire 4. However, the minutely worked lead frame deforms easily and it is difficult to handle such lead frame. Further, when the loop height of the wire 4 is kept low, there is a possibility that the wire 4 comes close to or contacts the corner portion of the semiconductor pellet 1 and the like and, thereby, deteriorating electrical isolation between the wire 4 and other portions of the semiconductor device or short-circuiting therebetween.

In the above-mentioned Japanese patent laid-open publication No. 6-125021 (prior art 1), there is also disclosed another chip type semiconductor device, which is shown in FIG. 18. In the semiconductor device shown in FIG. 18, instead of using the wire 4 used in the semiconductor device of FIG. 17, the semiconductor pellet 1 is inserted directly between lead portions 3a and 3b. However, since both the semiconductor pellet 1 and the lead portions 3a and 3b are minute, fabrication process becomes complicate and difficult. Also, after mounting the semiconductor pellet 1 on an island portion 2 of the lead portion 3a and electrically coupling the semiconductor pellet 1 with the lead portions 3a and 3b, undesired portions of the resin molded lead frame are cut away and a separate semiconductor device is obtained. In this case, if the lead portions 3a and 3b are cut in the proximity of an encapsulation resin portion 5, there is a possibility that cracks are produced in the encapsulation resin portion 5, and that lead portions 3a and 3b and the encapsulation resin portion 5 are delaminated at the interface therebetween and, thereby, moisture resistance of the semiconductor device is deteriorated. Therefore, it was impossible to cut the lead portions 3a and 3b in the proximity of the side wall portions of the encapsulation resin portion 5, and it was impossible to reduce the outer size of the semiconductor device much.

Japanese patent laid-open publication No. 7-169766 (prior art 2) discloses a semiconductor device which can be made thinner than the semiconductor device shown in FIG. 18. In the semiconductor device of the prior art 2, a semiconductor pellet is wholly molded by resin except electrode portions such that the electrode portions of the semiconductor pellet are exposed. Thereafter, projected electrodes are formed on the exposed electrode portions of the semiconductor pellet. However, in the semiconductor device having such structure, when the semiconductor pellet is molded by resin, it was difficult to precisely locate the semiconductor pellet within a metal molding die such that the electrode portions of the semiconductor pellet come into contact with protruded portions of inner wall of the metal molding die. It was also difficult to resin mold the semiconductor pellet without forming thin fin or flash of resin on the surface of each electrode portion.

Japanese patent laid-open publication No. 10-313082 (prior art 3) discloses a semiconductor device in which a flat lead frame is used and a semiconductor pellet is mounted on one surface of the lead frame. Also, the lead frame with the semiconductor pellet is resin molded such that the other surface of the lead frame is exposed.

However, when the whole portion of one of the surfaces of the lead frame is exposed from the mold resin, adhesiveness of lead portions and an island portion of the lead frame with the mold resin is deteriorated. Therefore, for example, when the semiconductor device is mounted on a wiring substrate and the like by soldering and the temperature of the lead portions and the island portion rises rapidly, there is a possibility that delamination occurs at the interface portion between the lead frame and the mold resin due to the difference in thermal expansion coefficient therebetween. Thus, it was difficult to maintain high moisture resistance of the semiconductor device.

SUMMARY OF THE INVENTION

Therefore, it is an object of the present invention to provide a chip type semiconductor device which is thin and has very small device size.

It is another object of the present invention to provide a chip type semiconductor device which is thin and has very small device size and which has high moisture resistance.

It is still another object of the present invention to provide a chip type semiconductor device which is thin and has very small device size and which can be manufactured easily.

It is still another object of the present invention to provide a chip type semiconductor device which is thin and has very small device size and which has high reliability.

It is still another object of the present invention to provide a chip type semiconductor device which is thin and has very small device size and which can be mounted on a wiring substrate and the like stably.

It is still another object of the present invention to obviate the disadvantages of the conventional chip type semiconductor device which is surface mountable.

According to an aspect of the present invention, there is provided a chip type semiconductor device comprising: an insulating substrate; first and second conductive land areas which are formed on the insulating substrate and which are electrically coupled with each other; a conductive post formed on the first conductive land area; a semiconductor pellet which has electrodes on both sides thereof and which is mounted on the second conductive land area, the electrode on one side of the semiconductor pellet being coupled onto the second conductive land area and the electrode on the other side of the semiconductor pellet having an external electrode electrically coupled thereto; and encapsulation resin portion which encapsulates a main area of the insulating substrate including the conductive post and the semiconductor pellet, wherein top portions of the conductive post and the external electrode electrically coupled to the semiconductor pellet being exposed from the encapsulation resin portion.

In this case, it is preferable that the conductive post and the external electrode electrically coupled to the semiconductor pellet are disposed such that top surfaces of the conductive post and the external electrode become approximately coplanar with each other.

It is also preferable that the conductive post is a column shaped conductive block member.

It is further preferable that the column shaped conductive block member is coupled to the first conductive land area via conductive adhesive.

It is advantageous that the column shaped conductive block member is coupled to the first conductive land area by using ultrasonic bonding.

It is also advantageous that the conductive post comprises a conductive member which is formed by plating.

It is further advantageous that the conductive post comprises a conductive member which is formed by using conductive adhesive.

It is preferable that the first and second conductive land areas are formed by a common conductive land portion which is partitioned by a resist film into the first and second conductive land areas.

It is also preferable that the external electrode electrically coupled with the semiconductor pellet is a flat board shaped conductive member joined onto the electrode of the semiconductor pellet.

It is further preferable that the external electrode electrically coupled with the semiconductor pellet is a hemispherical conductive member joined onto the electrode of the semiconductor pellet.

It is advantageous that the second conductive land area has a concave portion in which the semiconductor pellet is mounted.

According to another aspect of the present invention, there is provided a method of manufacturing a chip type semiconductor device comprising: preparing an insulating substrate; forming first and second conductive land areas on the insulating substrate, the first and second conductive land areas being electrically coupled with each other; forming a conductive post on the first conductive land area; mounting a semiconductor pellet which has electrodes on both sides thereof on the second conductive land area, the electrode on one side of the semiconductor pellet being coupled onto the second conductive land area and the electrode on the other side of the semiconductor pellet having an external electrode electrically coupled thereto; and encapsulating a main area of the insulating substrate including the conductive post and the semiconductor pellet with an encapsulation resin portion, wherein top portions of the conductive post and the external electrode electrically coupled to the semiconductor pellet being exposed from the encapsulation resin portion.

It is preferable that the conductive post and the external electrode electrically coupled to the semiconductor pellet are disposed such that top surfaces of the conductive post and the external electrode become approximately coplanar with each other.

It is also preferable that the conductive post is a column shaped conductive block member and, in the forming a conductive post on the first conductive land area, the column shaped conductive block member is coupled to the first conductive land area via conductive adhesive.

It is further preferable that the conductive post is a column shaped conductive block member and, in the forming a conductive post on the first conductive land area, the column shaped conductive block member is coupled to the first conductive land area by using ultrasonic bonding.

It is advantageous that the conductive post is formed by plating.

It is also advantageous that the conductive post is formed by using conductive adhesive.

It is further advantageous that the first and second conductive land areas are formed by a common conductive land portion which is partitioned by a resist film into the first and second conductive land areas.

It is preferable that the external electrode electrically coupled with the semiconductor pellet is a flat board shaped conductive member joined onto the electrode of the semiconductor pellet.

It is also preferable that the second conductive land area has a concave portion and, in the mounting a semiconductor pellet which has electrodes on both sides thereof on the second conductive land area, the semiconductor pellet is mounted on the concave portion.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
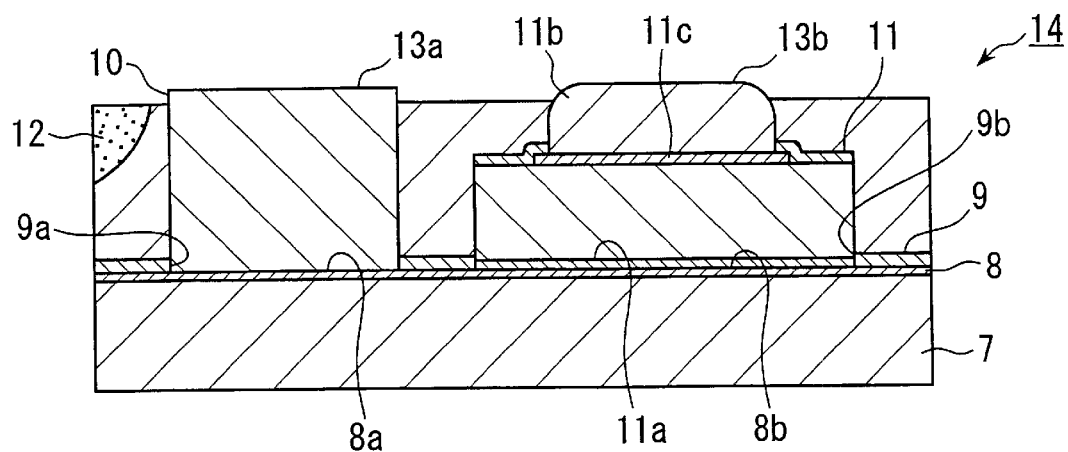
FIG. 1 is a side cross sectional view schematically showing a semiconductor device according to an embodiment of the present invention.

A chip type semiconductor device according to the present invention comprises at least first and second conductive land areas which are formed on an insulating substrate and which are electrically coupled with each other. A conductive post is formed on the first conductive land area, and a semiconductor pellet which has electrodes on both sides thereof is mounted on the second conductive land area. A main area on the insulating substrate including the conductive post and the semiconductor pellet is coated or encapsulated by an encapsulation resin portion. In this case, at least the top surface of the conductive post and external electrode or electrodes electrically coupled with the semiconductor pellet are exposed from the encapsulation resin portion at the outer surface of the encapsulation resin portion.

The top surfaces of the conductive post and the external electrode or electrodes coupled with the semiconductor pellet are preferably disposed to become approximately coplanar with each other. Thereby, the semiconductor device can be surface mounted on a wiring substrate and the like stably.

As the conductive post of the above-mentioned semiconductor device, it is possible to use a column shaped conductive block. In this case, the conductive post and the first conductive land area can be joined by using conductive adhesive such as solder, silver paste and the like. It is also possible to directly join the conductive post and the first conductive land area by applying ultrasonic vibration to the conductive post in a condition both the conductive post and the first conductive land area are pressured toward each other at the interface therebetween. In this case, it is necessary to appropriately select materials, surface condition and the like of the first conductive land area and of the conductive post according to a known ultrasonic bonding technology.

The conductive post can be formed as a projection formed by plating. Also, the conductive post can be formed by stacking conductive adhesive such as silver paste and the like.

The first and second conductive land areas in the semiconductor device according to the present invention can be separately formed and electrically coupled together. Also, the first and second conductive land areas can be formed by partitioning a common conductive land by using a photo resist film and the like.

A conductive member is coupled onto an electrode surface of the semiconductor pellet on the side opposite from the side of the insulating substrate, and the conductive member is exposed from the encapsulation resin portion and used as an external electrode. The conductive member can be composed of a flat board shaped conductive member. The area of the conductive member or the flat board shaped conductive member may be smaller than that of the electrode surface of the semiconductor pellet. However, it is also possible to use the conductive member having an area larger than that of the electrode surface. In such case, it is possible to reduce electrical resistance of the electrode and also to disperse heat produced by the semiconductor pellet efficiently. Also, instead of using the above-mentioned flat board shaped conductive member, the conductive member may be a spherical or hemispherical member. Such spherical or hemispherical member can be formed, for example, by melting low melting point metal or alloy on the electrode surface of the semiconductor pellet or on the flat board shaped conductive member formed on the electrode surface of the semiconductor pellet.

Further, it is possible to form a concave portion in the second conductive land area on the insulating substrate on which the semiconductor pellet is to be mounted, and to dispose the semiconductor pellet within the concave portion.

By using such structure, it is possible to reduce the projection height of the semiconductor pellet from the surface of the insulating substrate, and thereby to relatively reduce the height of the conductive post.

Figure 2:
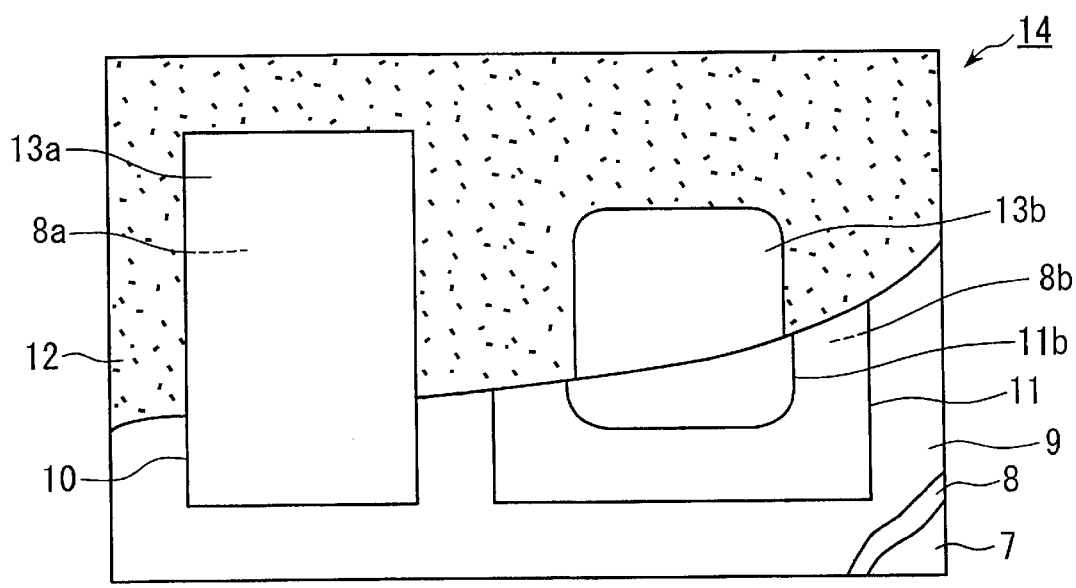
FIG. 2 is a plan view partly in cross section showing the semiconductor device of FIG. 1.

Hereafter, with reference to the drawings, embodiments of the present invention will be described in detail. FIG. 1 is a side cross sectional view schematically showing a semiconductor device 14 according to an embodiment of the present invention. FIG. 2 is a plan view partly in cross section showing the semiconductor device of FIG. 1. The semiconductor device shown in FIGS. 1 and 2 comprises an insulating substrate 7 which has, for example, rectangular shape and which is made of heat resistant material, for example, ceramics, resin and the like. Reference numeral 8 designates a conductive land portion formed on the insulating substrate 7. Although not shown in the drawing, preferably, the peripheral portion of the conductive land portion 8 is removed along the edge portion of the insulating substrate 7 by etching and the like.

A photo resist film 9 is formed on the conductive land portion 8 on the insulating substrate 7, and the photo resist film 9 coats the conductive land portion 8 except two conductive land areas 8a and 8b. That is, the photo resist film 9 has, for example, two windows 9a and 9b and exposes the conductive land areas 8a and 8b of the conductive land portion 8 via the windows 9a and 9b, respectively.

A conductive post 10 stands on the first conductive land area 8a and electrically coupled onto the first conductive land area 8a. In the embodiment shown in FIG. 1 and FIG. 2, the conductive post 10 comprises a column shaped block member made of conductive material. A reference numeral 11 designates a semiconductor pellet which has electrodes 11a and 11c on both surfaces thereof. One of the flat electrode 11a is electrically coupled to the second conductive land portion 8b. On the other electrode 11c, there is formed a projected electrode 11b. In this embodiment, the top surface of the projected electrode 11b is approximately flat, and the cross sectional area of the projected electrode 11b becomes slightly larger from the top surface thereof toward the bottom surface thereof. The semiconductor pellet 11 may be a two terminal type semiconductor device such as a diode and the like, or may be a semiconductor device having more than two terminals such as transistor and the like.

A reference numeral 12 designates an encapsulation resin portion which coats or encapsulates a main portion on the insulating substrate 7 such that the top portion or the external end portion of the conductive post 10 and the top portion of the projected electrode 11b on the semiconductor pellet 11 are exposed. The external end portion of the conductive post 10 and the top portion of the projected electrode 11b exposed from the encapsulation resin portion 12 constitute external electrodes 13a and 13b for coupling the semiconductor device 14 with an external circuit. It is preferable that the heights of the top surfaces of the external electrodes 13a and 13b are approximately the same, that is, the top surfaces of the external electrodes 13a and 13b are coplanar with each other. In such case, the semiconductor device 14 can be easily and stably surface mounted on a wiring substrate and the like.

Figure 3:
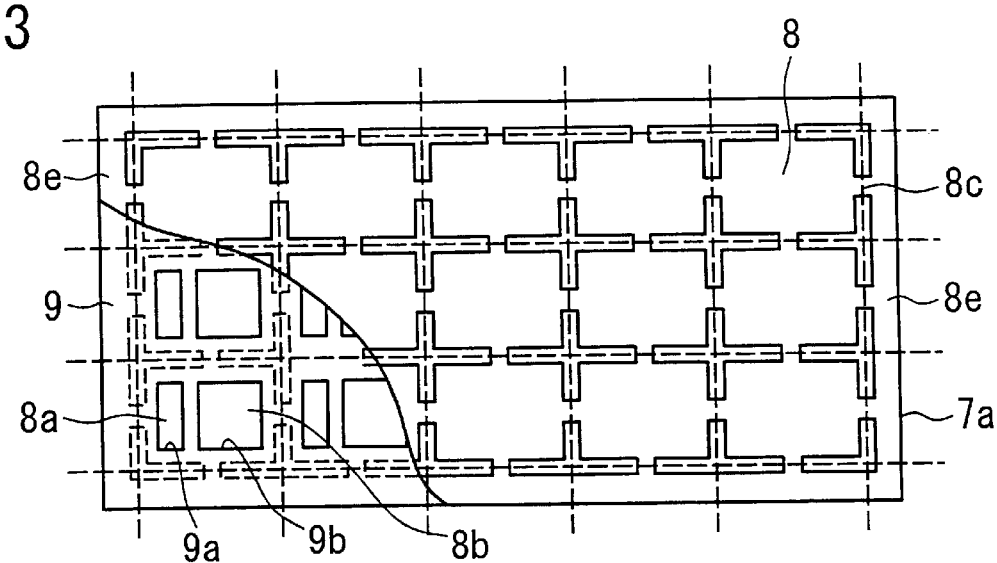
FIG. 3 is a plan view showing an insulating substrate board used for fabricating the semiconductor device shown in FIG. 1.

With reference to FIG. 3 to FIG. 7, an explanation will be made on a method of manufacturing the above-mentioned semiconductor device. First, as shown in FIG. 3, an insulating substrate board 7a is prepared which is a thin board like member or a sheet like member and which preferably has a large width and a long size. On at least one of the major surfaces of the insulating board 7a, there is formed a conductive film 8e. The insulating board 7a is partitioned into a plurality of device areas shown by dotted lines in FIG. 3. Each of the device areas has a predetermined sizes or shape. The conductive film 8e is etched away along the border lines between the device areas except narrow portions 8c, thereby conductive land portions 8 are formed. The conductive land portions 8 are electrically coupled together by the narrow portions 8c. The narrow portions 8c may be used, for example, for electrically coupling the conductive land portions 8 with each other for electroplating.

The insulating board 7a is covered with a photo resist film 9. The photo resist film 9 has two openings 9a and 9b on each of the conductive land portions 8. Portions of the conductive land portions 8 are exposed via the openings 9a and 9b and thereby first and second conductive land areas 8a and 8b are formed, respectively.

Figure 4:
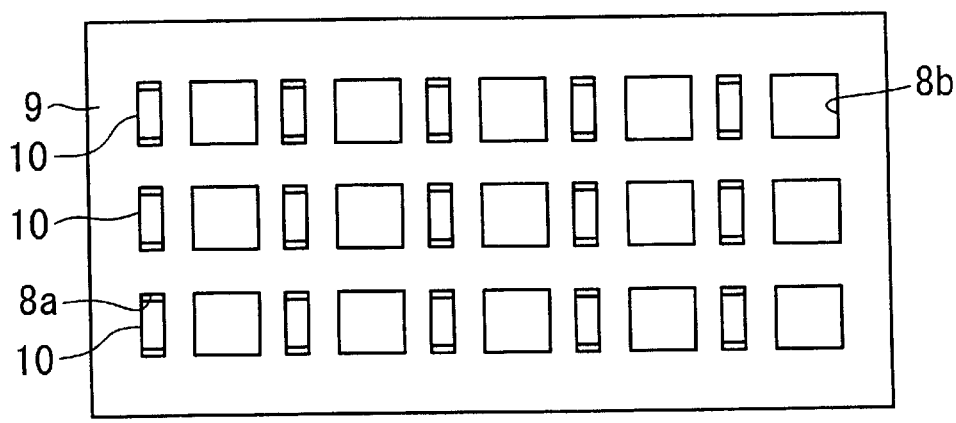
FIG. 4 is a plan view showing the insulating substrate board after forming conductive posts thereon.

Next, as shown in FIG. 4, a conductive post 10 is coupled onto the first conductive land area 8a of the insulating board 7a. Although not illustrated in the drawings, the conductive post 10 can be fabricated, for example, by cutting a metal flat plate stuck on an adhesive sheet by using a rotating blade or a dicing saw. Each conductive post 10 can be supplied onto the first conductive land area 8a by using, for example, a suction collet or transfer collet. The conductive post 10 and the first conductive land area 8a are electrically coupled by using conductive adhesive (not shown in the drawing) such as solder, silver paste and the like.

Figure 5:
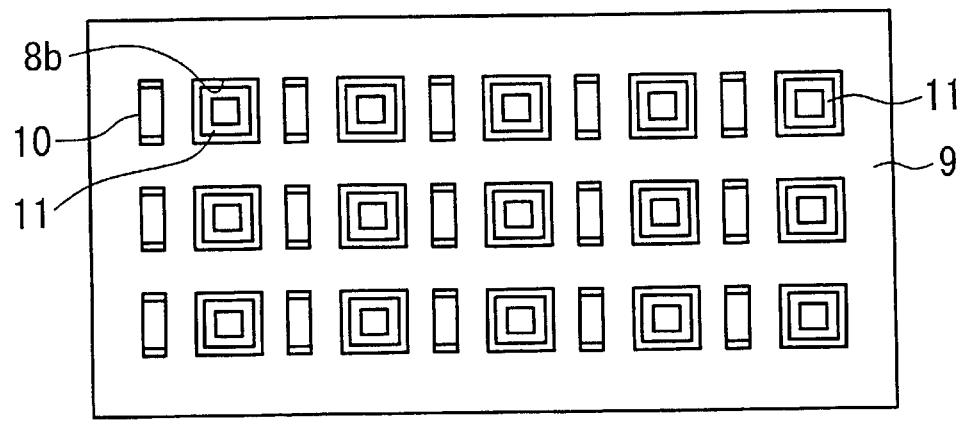
FIG. 5 is a plan view showing the insulating substrate board after mounting semiconductor pellets thereon.

As shown in FIG. 5, a semiconductor pellet 11 is then mounted on the second conductive land area 8b. Similarly to the conductive post 10, the semiconductor pellet 11 is electrically coupled onto the second conductive land area 8b by using conductive adhesive. As mentioned above, a projected electrode 11b is formed on the semiconductor pellet 11, and the top end of the conductive post 10 and the top end of the projected electrode 11b have approximately the same height, i.e., are coplanar with each other.

Figure 6:
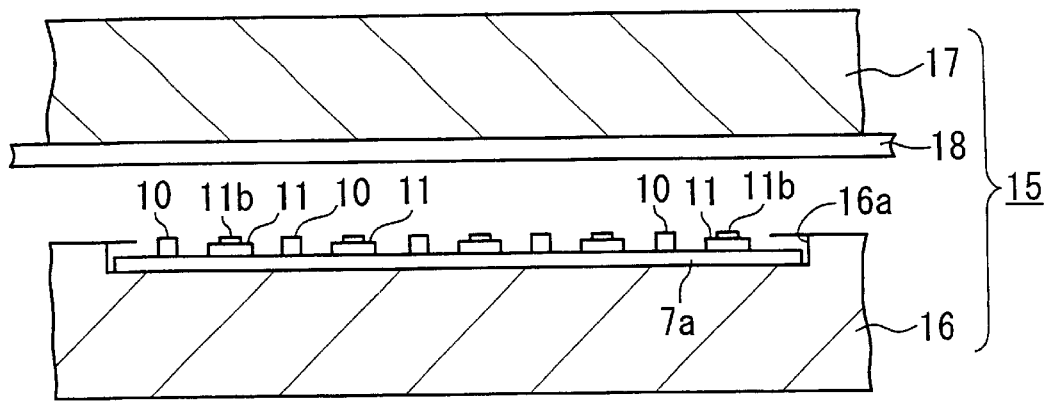
FIG. 6 is a side cross sectional view schematically showing a main part of a molding equipment used for encapsulating the insulating substrate board of FIG. 5.

As shown in FIG. 6, the workpiece, i.e., the insulating substrate board 7a on which the conductive posts 10 and the semiconductor pellets 11 are mounted in this way is supplied to a resin molding equipment 15. The resin molding equipment 15 includes lower metal molding die 16 and an upper metal molding die 17. The lower metal molding die 16 has a cavity 16a which is formed in the upper surface portion thereof and which contains or holds the insulating board 7a. In the lower metal molding die 16, there are also formed pot or pots, runner or runners, gate or gates and the like for supplying fluid resin to the cavity 16a. However, for the sake of simplicity, illustration of such components is omitted here. The depth of the cavity 16a is determined such that the upper ends of the conductive post 10 and the projected electrode 11b of the semiconductor pellet 11 project from the opening surface of the cavity 16a or the upper surface of the lower metal molding die 16. The upper metal molding die 17 has a flat lower surface. Along the lower surface of the upper metal molding die 17, there is disposed a buffering sheet 18. The buffering sheet 18 is made, for example, of resilient or elastic resin material.

Figure 7:
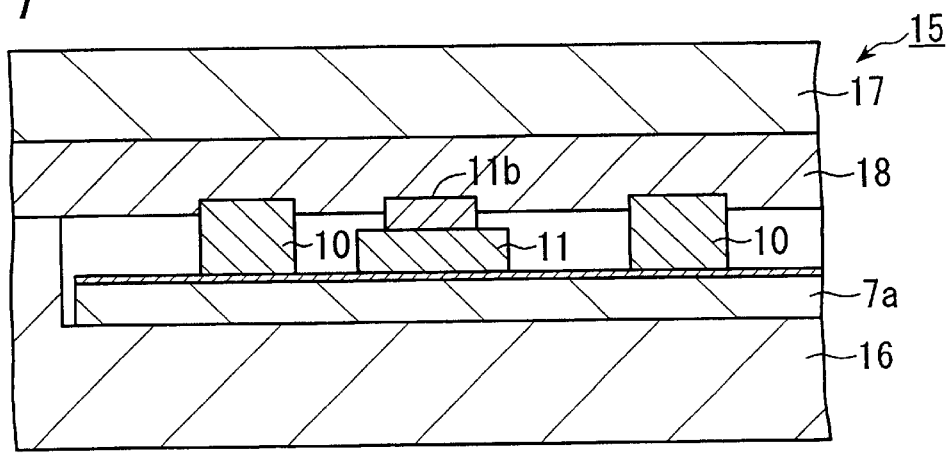
FIG. 7 is a side cross sectional view showing the molding equipment of FIG. 6 during a resin molding operation.

As shown in FIG. 7, when the upper metal molding die 17 and the lower metal molding die 16 are clamped, the buffering sheet 18 is pinched and held between the upper metal molding die 17 and the lower metal molding die 16. In this case, the top end portions of the conductive post 10 and the projected electrode 11b which protrude from the cavity 16a are plunged into the buffering sheet 18, and the insulating board 7a is pressed onto the lower metal molding die 16. In this condition, fluid resin is supplied into the cavity 16a, and thereby portions on the insulating board 7a are coated and filled with resin except portions of the conductive post 10 and the projected electrode 11b. After the resin coating on the insulating board 7a is completed and the resin is semi-cured, the upper metal molding die 17 and the lower metal molding die 16 are separated and the workpiece molded by resin is taken out from the molding equipment. The workpiece molded by resin is cut along the dotted lines shown in FIG. 3, and the semiconductor devices shown in FIG. 1 are obtained.

In the above-mentioned semiconductor device, the projected electrode 11b on the semiconductor pellet 11 and the conductive post 10 expose from the encapsulation resin portion 12 such that the height of the projected electrode 11b and the height of the conductive post 10 become approximately the same. Therefore, the thickness of the encapsulation resin portion 12 of the above-mentioned semiconductor device can be thinner than that of the encapsulation resin portion of the conventional semiconductor device which uses a bonding wire. Therefore, by constituting the insulating substrate 7 by a thin substrate, it is possible to realize a very thin semiconductor device which does not have the disadvantages of deterioration of electrical isolation and of short-circuiting. Also, since the above-mentioned semiconductor device can be fabricated approximately by mounting the conductive post 10 and the semiconductor pellet 11 on the insulating substrate 7 and by performing encapsulation by resin, the semiconductor device can be easily fabricated by a simple process. Also, the external electrodes 13a and 13b for coupling the semiconductor device with an external circuit can be formed easily such that the external electrodes 13a and 13b are exposed from the encapsulation resin portion 12, by using the buffering sheet 18 which is pressed on the conductive post 10 and the projected electrode 11b of the semiconductor pellet 11. Therefore, after forming the encapsulation resin portion 12, excessively large external force is not applied to the encapsulation resin portion 12 having minute sizes, so that the encapsulation resin portion 12 does not undergo damage such as cracking, delamination and the like. As a result, it is possible to retain high moisture resistance even if the semiconductor device is downsized and even if the thickness of the semiconductor device is decreased. Also, the insulating substrate board 7a can be that having a standardized size and shape, and therefore can be easily supplied to the resin molding equipment 15 and can be easily located within the cavity 16a of the lower metal molding die 16 of the resin molding equipment 15. Further, the resin molding can be done without forming thin fin or flash of resin on the surface of the external electrodes 13a and 13b. The insulating substrate 7 protects the semiconductor pellet 11 from moisture of outside, and the adhesion between the insulating substrate 7 and the conductive land portion 8 is strong and tight. Therefore, even if the thickness of the encapsulation resin is thin, moisture resistance of the above-mentioned semiconductor device is not deteriorated. Also, since the semiconductor device according to the present invention does not use a lead frame, even if the temperature of the external electrodes and the like of the semiconductor device rapidly becomes high when the semiconductor device is mounted on an external printed circuit board and the like by soldering, delamination hardly occurs at the interface between the encapsulation resin and other portions. Therefore, it is possible to retain high moisture resistance.

In the above-mentioned embodiment, the conductive post 10 comprises a conductive block member which is formed by dicing a metal flat plate. Also, the conductive post 10 is electrically coupled onto the conductive land area by using soldering or silver paste. However, it is also possible to couple the conductive post 10 directly onto the conductive land area without using the conductive adhesive. That is, it is possible to couple the conductive post 10 onto the conductive land area by pressuring the conductive post 10 onto the conductive land area and applying ultrasonic vibration thereto.

Figure 8:
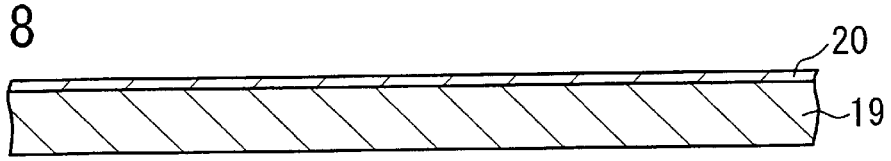
FIG. 8 is a side cross sectional view schematically showing an insulating substrate board used for fabricating a semiconductor device according to another embodiment of the present invention.
Figure 9:
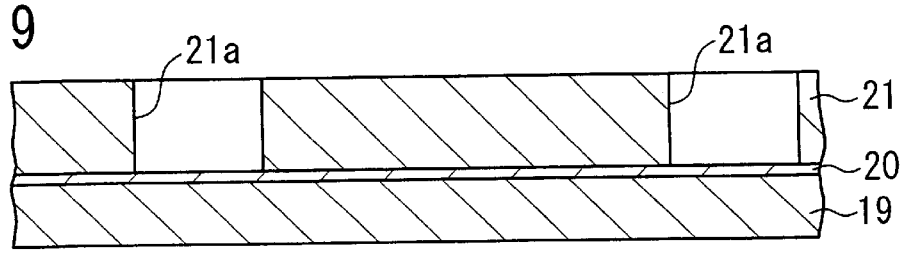
FIG. 9 is a side cross sectional view showing an operation of forming a photo resist film on the insulating substrate board shown in FIG. 8.

It is also possible to form a conductive post by plating. With reference to FIG. 8 to FIG. 12, an explanation will be made on a method of forming the conductive post by plating. In FIG. 8, a reference numeral 19 designates an insulating substrate board, and a conductive film 20 is formed on at least one surface of the insulating substrate board 19. On the conductive film 20 on the insulating substrate 19, a photo-sensitive resin film or photo resist film 21 is formed and, by removing portions of the photo resist film 21, openings 21a are formed in the photo resist film 21. Via the openings 21a, portions of the conductive film 20 are exposed, as shown in FIG. 9.

Figure 10:
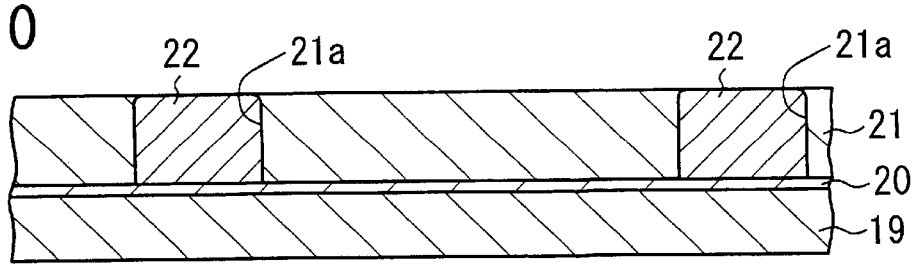
FIG. 10 is a side cross sectional view illustrating a process of forming conductive posts by plating in openings formed in the photo resist film shown in FIG. 9.
Figure 11:
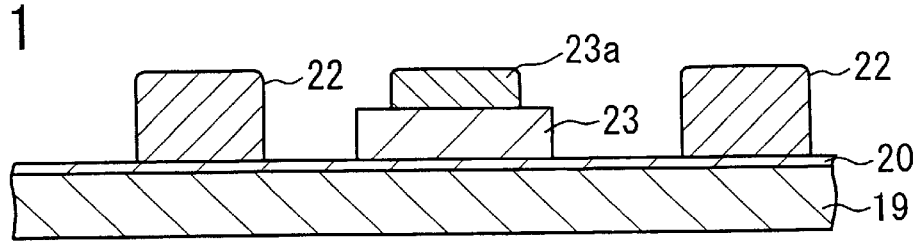
FIG. 11 is a side cross sectional view illustrating a process of mounting a semiconductor pellet on the insulating substrate board on which the conductive posts are formed.

Next, as shown in FIG. 10, plated layer portions 22 of metal or metal alloy are formed in the openings 21a on the insulating substrate 19 by plating. After forming the plated layer portions 22, the photo resist film 21 is removed and the conductive film 20 is again exposed. Thereby, as shown in FIG. 11, the plated layer portions 22 become conductive posts which stand on the conductive film 20.

Then, a semiconductor pellet 23 is mounted on the conductive film 20 at a predetermined location on the side of the conductive post 22. The semiconductor pellet 23 has a projected electrode 23a formed on the top surface thereof. The height of the plated layer portion 22, that is, the conductive post 22, is determined to be approximately the same as that of the semiconductor pellet 23 which has the projected electrode 23a. For example, when the semiconductor pellet 23 comprises a semiconductor substrate portion having a thickness of 150 μm and the projected electrode formed thereon having a thickness of 75 μm, the height of the conductive post 22 is set to be approximately 230 μm, taking the thickness of coupling portion or portions of the semiconductor pellet 23 into consideration.

Figure 12:
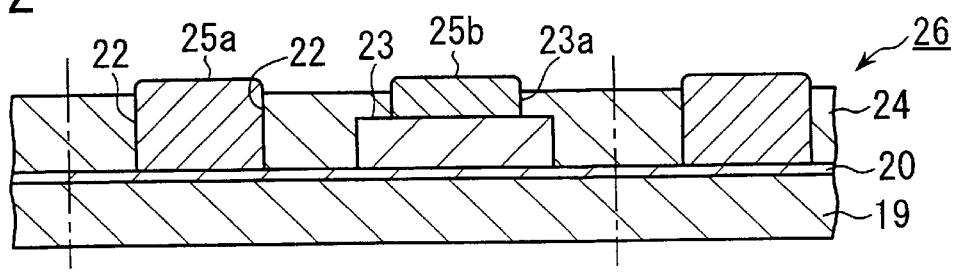
FIG. 12 is a side cross sectional view illustrating a workpiece for semiconductor devices that comprises the insulating substrate which has the conductive posts and the semiconductor pellets mounted thereon and which is encapsulated by resin.

Thereafter, similarly to the semiconductor device of FIG. 1, the insulating substrate 19 is coated with resin except the upper end portions of the conductive post 22 and the projected electrode 23a to form an encapsulation resin portion 24, as shown in FIG. 12. The upper end portions of the conductive post 22 and the projected electrode 23a exposed from the encapsulation resin portion 24 constitute external electrodes 25a and 25b, respectively. The workpiece molded by the encapsulation resin portion 24 is cut into separate pieces to obtain chip type semiconductor devices 26.

The semiconductor device mentioned above has the same advantageous effects as those of the semiconductor device of FIG. 1. Further, in the semiconductor device mentioned above, when a large number of semiconductor devices are formed on the insulating substrate board 19, a large number of conductive posts 22 can be formed all together by plating. Therefore, although application, exposure, removal and the like of the photo resist film 21 are additionally required, it is possible to simplify the manufacturing process of the semiconductor device, when compared with the manufacturing of the semiconductor device of FIG. 1 in which the conductive post 10 is coupled onto the first conductive land area 8a.

Figure 13:
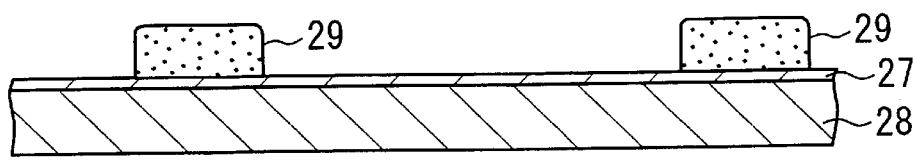
FIG. 13 is a side cross sectional view schematically showing an insulating substrate board used for fabricating a semiconductor device according to still another embodiment of the present invention.
Figure 14:
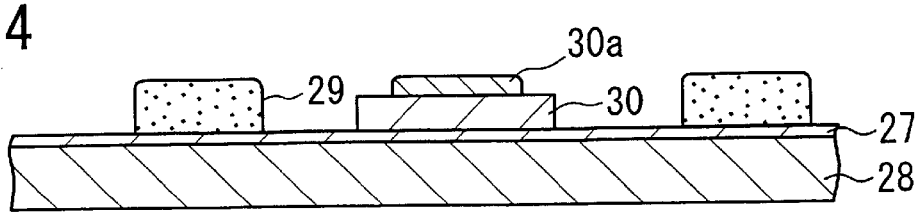
FIG. 14 is a side cross sectional view illustrating a process of mounting a semiconductor pellet on the insulating substrate board shown in FIG. 13 on which the conductive posts are formed.
Figure 15:
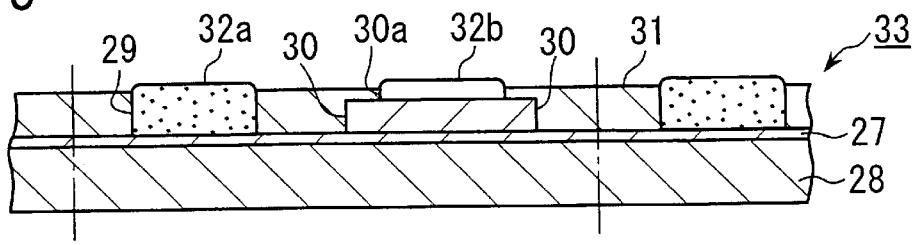
FIG. 15 is a side cross sectional view illustrating a workpiece for semiconductor devices that comprises the insulating substrate board shown in FIG. 13 which has the conductive posts and the semiconductor pellets mounted thereon and which is encapsulated by resin.

As still another embodiment, it is possible to fabricate a conductive post by using conductive adhesive. With reference to FIG. 13 to FIG. 15, an explanation will be made on a method of forming the conductive post by using conductive adhesive. In FIG. 13, a reference numeral 28 designates an insulating substrate or insulating substrate board, and a conductive film 27 is formed on at least one surface of the insulating substrate 28. On portions of the conductive film 27 on the insulating substrate 28, there are formed conductive adhesive layer portions 29 which become the conductive posts. The conductive adhesive layer portions 29 can be formed by using an alloy having low melting point such as solder and the like, or by using conductive adhesive of resin system in which minute particles of conductive material are dispersed in adhesive of resin system. In case the conductive adhesive is solder, although not shown in the drawing, it is possible to form the layer portions 29 by forming a solder resist film on the conductive film 27 and forming openings at necessary portions in the solder resist film. Then, by applying solder paste via the solder resist film, the conductive adhesive layer portions 29 are formed at the openings of the solder resist film. In case the conductive adhesive is the adhesive of resin system, the conductive adhesive layer portions 29 can be formed into predetermined patterns having predetermined thickness by using a screen printing method. When a large thickness is required, the conductive adhesive can be applied or printed again, thereby any desired thickness can be obtained. After forming the conductive adhesive layer portions 29, in case the layer portions 29 are made of solder, the solder resist film is removed, and the conductive film 27 is exposed.

As shown in FIG. 14, a semiconductor pellet 30 is then mounted on the conductive film 27 at a predetermined location adjacent to the conductive post 29. The semiconductor pellet 30 has a projected electrode 30a formed on the top surface thereof. The backside electrode (not shown in the drawing) of each of the semiconductor pellets 30 is electrically joined to the conductive film 27 and, therefore, is electrically coupled with the conductive adhesive layer portion 29 via the conductive film 27. The height of the conductive adhesive layer portion 29, that is, the conductive post, is approximately the same as that of the projected electrode 30a.

Thereafter, similarly to the semiconductor device of FIG. 1, the insulating substrate 28 is coated with resin except the upper end portions of the conductive post 29 and the projected electrode 30a to form an encapsulation resin portion 31, as shown in FIG. 15. The upper end portions of the conductive post 29 and the projected electrode 30a exposed from the encapsulation resin portion 31 constitute external electrodes 32a and 32b, respectively. The workpiece molded by the encapsulation resin portion 31 is cut into separate pieces to obtain chip type semiconductor devices 33.

Figure 16:
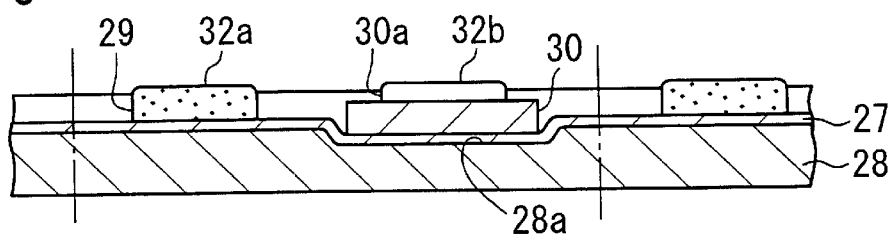
FIG. 16 is a side cross sectional view illustrating a workpiece for semiconductor devices according to still another embodiment of the present invention.
Figure 17:
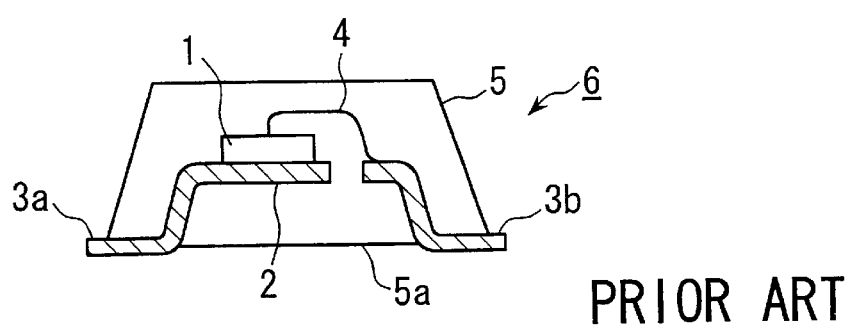
FIG. 17 is a side cross sectional view illustrating an example of a conventional semiconductor device which uses a leadframe.
Figure 18:
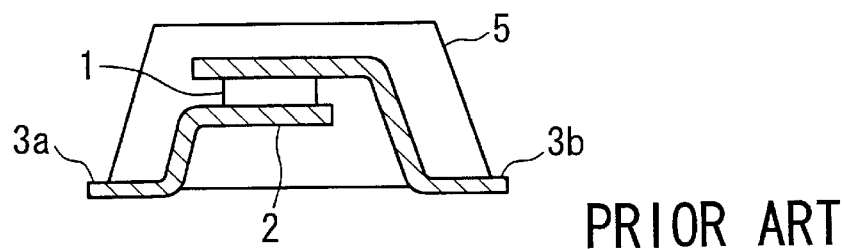
FIG. 18 is a side cross sectional view illustrating another example of a conventional semiconductor device which is a variation of the semiconductor device of FIG. 17.

The semiconductor device mentioned above has the same advantageous effects as those of the semiconductor device of FIG. 1. Further, in the semiconductor device mentioned above, when a large number of semiconductor devices are formed on the insulating substrate board 28, a large number of conductive posts 29 can be formed all together at the same time by using conductive adhesive, and thereby productivity of the device is improved. Also, when the conductive adhesive layer portions 29 are formed by using resin type adhesive, it is possible to obtain any desired height of the conductive posts. Therefore, it is possible to easily fabricate the conductive posts corresponding to the semiconductor pellets having various heights. Further, when each of the conductive adhesive layer portions 29 is formed by using an alloy having low melting point such as solder and the like, the height of the conductive post relates to the area of the conductive post. In such case, when it is desired to obtain a large height, a structure shown in FIG. 16 can be used. That is, as shown in FIG. 16, the semiconductor pellet 30 is mounted in a concave portion 28a formed in an area in which the semiconductor pellet 30 is to be mounted. By this structure, it becomes possible to adjust the height of the conductive post 29 and the semiconductor pellet portion even when the height of the conductive post 29 is relatively small.

The present invention is not limited to the above-mentioned embodiments. For example, an electrode attached to the semiconductor pellet for coupling the semiconductor pellet with an external circuit is not limited to the above-mentioned projected electrode having a flat upper surface, but can be an electrode having a hemispherical shape or a curved upper surface. For example, by dipping a semiconductor pellet having a flat electrode formed thereon in melted solder, it is possible to obtain such projected electrode having hemispherical shape and the like. As another example of the projected electrode of the semiconductor pellet, it is possible to bond a conductive member having a chip shape similar to the conductive post of the semiconductor device of FIG. 1 to a flat electrode formed on the semiconductor pellet.

As mentioned above, according to the present invention, it is possible to realize a chip type semiconductor device which is surface mountable and which is thin and has very small device size. The chip type semiconductor device according to the present invention also has high moisture resistance, and is easy to manufacture.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as falling within the scope of the appended claims.

What is claimed is:

1. A chip type semiconductor device comprising:

an insulating substrate;

first and second conductive land areas which are formed on said insulating substrate and which are electrically coupled with each other;

a conductive post formed on said first conductive land area;

a semiconductor pellet which has electrodes on both sides thereof and which is mounted on said second conductive land area, said electrode on one side of said semiconductor pellet being coupled onto said second conductive land area and said electrode on the other side of said semiconductor pellet having an external electrode electrically coupled thereto; and encapsulation resin portion which encapsulates a main area of said insulating substrate including said conductive post and said semiconductor pellet, wherein top portions of said conductive post and said external electrode electrically coupled to said semiconductor pellet being exposed from said encapsulation resin portion.

2. A chip type semiconductor device as set forth in claim 1, wherein said conductive post and said external electrode electrically coupled to said semiconductor pellet are disposed such that top surfaces of said conductive post and said external electrode become approximately coplanar with each other.

3. A chip type semiconductor device as set forth in claim 1, wherein said conductive post is a column shaped conductive block member.

4. A chip type semiconductor device as set forth in claim 3, wherein said column shaped conductive block member is coupled to said first conductive land area via conductive adhesive.

5. A chip type semiconductor device as set forth in claim 3, wherein said column shaped conductive block member is coupled to said first conductive land area by using ultrasonic bonding.

6. A chip type semiconductor device as set forth in claim 1, wherein said conductive post comprises a conductive member which is formed by plating.

7. A chip type semiconductor device as set forth in claim 1, wherein said conductive post comprises a conductive member which is formed by using conductive adhesive.

8. A chip type semiconductor device as set forth in claim 1, wherein said first and second conductive land areas are formed by a common conductive land portion which is partitioned by a resist film into said first and second conductive land areas.

9. A chip type semiconductor device as set forth in claim 1, wherein said external electrode electrically coupled with said semiconductor pellet is a flat board shaped conductive member joined onto said electrode of said semiconductor pellet.

10. A chip type semiconductor device as set forth in claim 1, wherein said external electrode electrically coupled with said semiconductor pellet is a hemispherical conductive member joined onto said electrode of said semiconductor pellet.

11. A chip type semiconductor device as set forth in claim 1, wherein said second conductive land area has a concave portion in which said semiconductor pellet is mounted.

12. A method of manufacturing a chip type semiconductor device comprising:

preparing an insulating substrate;

forming first and second conductive land areas on said insulating substrate, said first and second conductive land areas being electrically coupled with each other;

forming a conductive post on said first conductive land area;

mounting a semiconductor pellet which has electrodes on both sides thereof on said second conductive land area, said electrode on one side of said semiconductor pellet being coupled onto said second conductive land area and said electrode on the other side of said semiconductor pellet having an external electrode electrically coupled thereto; and encapsulating a main area of said insulating substrate including said conductive post and said semiconductor pellet with an encapsulation resin portion, wherein top portions of said conductive post and said external electrode electrically coupled to said semiconductor pellet being exposed from said encapsulation resin portion.

13. A method of manufacturing a chip type semiconductor device as set forth in claim 12, wherein said conductive post and said external electrode electrically coupled to said semiconductor pellet are disposed such that top surfaces of said conductive post and said external electrode become approximately coplanar with each other.

14. A method of manufacturing a chip type semiconductor device as set forth in claim 12, wherein said conductive post is a column shaped conductive block member and, in said forming a conductive post on said first conductive land area, said column shaped conductive block member is coupled to said first conductive land area via conductive adhesive.

15. A method of manufacturing a chip type semiconductor device as set forth in claim 12, wherein said conductive post is a column shaped conductive block member and, in said forming a conductive post on said first conductive land area, said column shaped conductive block member is coupled to said first conductive land area by using ultrasonic bonding.

16. A method of manufacturing a chip type semiconductor device as set forth in claim 12, wherein said conductive post is formed by plating.

17. A method of manufacturing a chip type semiconductor device as set forth in claim 12, wherein said conductive post is formed by using conductive adhesive.

18. A method of manufacturing a chip type semiconductor device as set forth in claim 12, wherein said first and second conductive land areas are formed by a common conductive land portion which is partitioned by a resist film into said first and second conductive land areas.

19. A method of manufacturing a chip type semiconductor device as set forth in claim 12, wherein said external electrode electrically coupled with said semiconductor pellet is a flat board shaped conductive member joined onto said electrode of said semiconductor pellet.

20. A method of manufacturing a chip type semiconductor device as set forth in claim 12, wherein said second conductive land area has a concave portion and, in said mounting a semiconductor pellet which has electrodes on both sides thereof on said second conductive land area, said semiconductor pellet is mounted on said concave portion.

* * * * *